(12) United States Patent
Su et al.

(10) Patent No.: US 10,396,216 B2
(45) Date of Patent: Aug. 27, 2019

(54) DEVICE INCLUDING A SIDEWALL SCHOTTKY INTERFACE

(71) Applicant: SEMICONDUCTOR COMPONENTS INDUSTRIES, LLC, Phoenix, AZ (US)

(72) Inventors: Yi Su, Cupertino, CA (US); Ashok Challa, Milpitas, CA (US); Tirthajyoti Sarkar, Sunnyvale, CA (US); Min Kyung Ko, Bucheon (KR)

(73) Assignee: Semiconductor Components Industries, LLC, Phoenix, AZ (US)

( * ) Notice: Subject to any disclaimer, the term of this patent is extended or adjusted under 35 U.S.C. 154(b) by 2 days.

(21) Appl. No.: 15/585,839

(22) Filed: May 3, 2017

(65) Prior Publication Data

US 2018/0323273 A1   Nov. 8, 2018

(51) Int. Cl.
*H01L 29/47* (2006.01)
*H01L 29/78* (2006.01)
*H01L 29/872* (2006.01)
*H01L 29/06* (2006.01)
*H01L 29/40* (2006.01)

(52) U.S. Cl.
CPC ........ *H01L 29/872* (2013.01); *H01L 29/0623* (2013.01); *H01L 29/7839* (2013.01); *H01L 29/8725* (2013.01); *H01L 29/407* (2013.01)

(58) Field of Classification Search
None
See application file for complete search history.

(56) References Cited

U.S. PATENT DOCUMENTS

| 6,351,018 | B1 | 2/2002 | Sapp | |
|---|---|---|---|---|
| 7,504,306 | B2 | 3/2009 | Sapp et al. | |
| 7,564,099 | B2 | 7/2009 | He et al. | |
| 7,638,841 | B2 | 12/2009 | Challa | |
| 8,093,651 | B2 | 1/2012 | Bhalla et al. | |
| 2013/0075808 | A1* | 3/2013 | Calafut | H01L 27/06 257/328 |
| 2013/0168761 | A1* | 7/2013 | Hsieh | H01L 29/407 257/330 |
| 2013/0214350 | A1* | 8/2013 | Hsieh | H01L 27/0629 257/334 |
| 2014/0151790 | A1* | 6/2014 | Lui | H01L 27/0629 257/334 |

* cited by examiner

*Primary Examiner* — Alexander G Ghyka
(74) *Attorney, Agent, or Firm* — Brake Hughes Bellermann LLP

(57) ABSTRACT

In one general aspect, a device can include a first trench disposed in a semiconductor region, a second trench disposed in the semiconductor region, and a recess disposed in the semiconductor region between the first trench and the second trench. The recess has a sidewall and a bottom surface. The device also includes a Schottky interface along a sidewall of the recess and the bottom surface of the recess excludes a Schottky interface.

17 Claims, 11 Drawing Sheets

DEVICE INCLUDING A SIDEWALL SCHOTTKY INTERFACE

TECHNICAL FIELD

This description relates to a device including a sidewall Schottky interface.

BACKGROUND

Known Schottky devices are vulnerable to a variety of manufacturing defects. Also, known Schottky devices can have undesirable performance characteristics. Thus, a need exists for systems, methods, and apparatus to address the shortfalls of present technology and to provide other new and innovative features.

SUMMARY

In one general aspect, a device can include a first trench disposed in a semiconductor region, a second trench disposed in the semiconductor region, and a recess disposed in the semiconductor region between the first trench and the second trench. The recess has a sidewall and a bottom surface. The device also includes a Schottky interface along a sidewall of the recess and the bottom surface of the recess excludes a Schottky interface.

DETAILED DESCRIPTION

Figure 1:
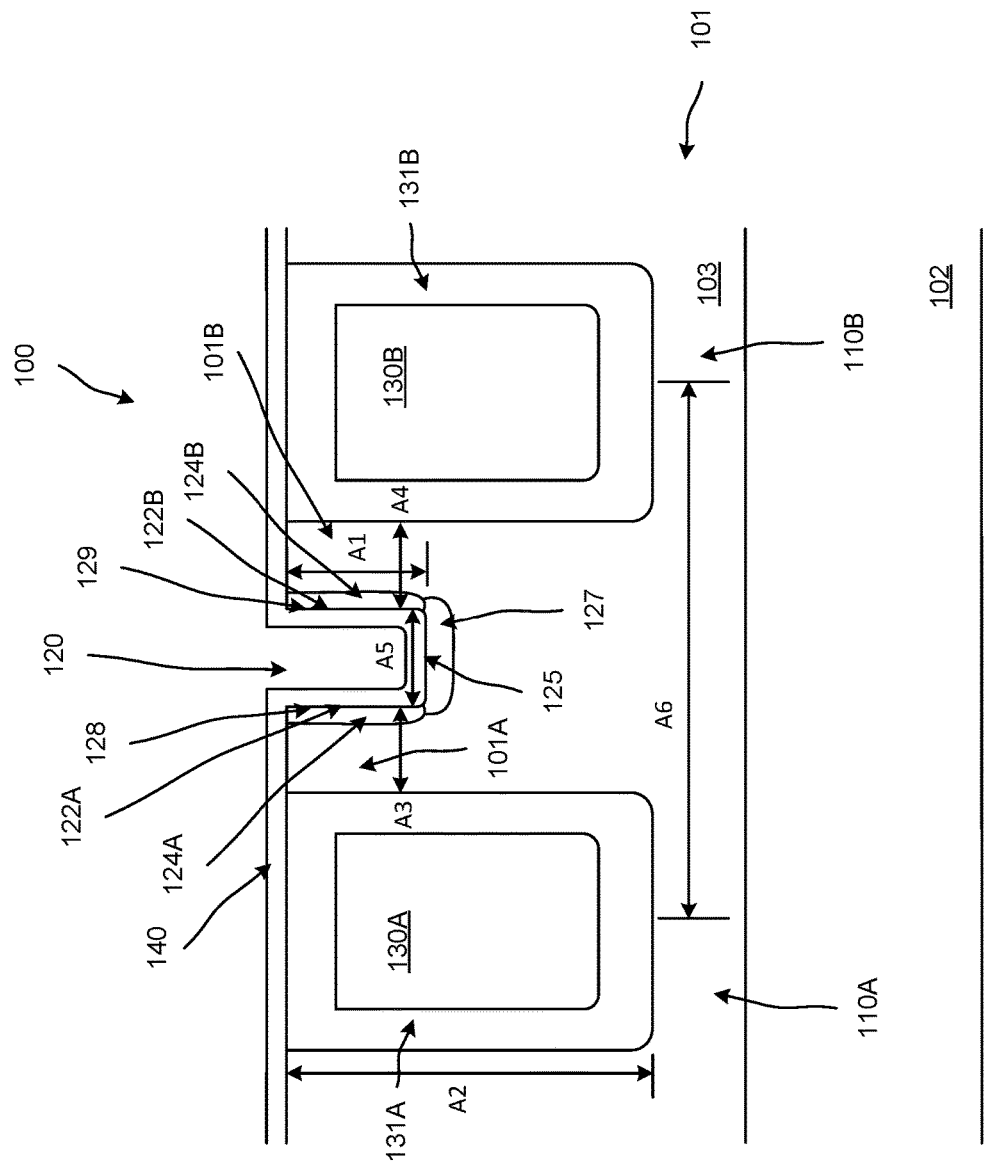
FIG. 1 is a diagram that illustrates a side cross-sectional view of a Schottky device including sidewalls Schottky interfaces.

FIG. 1 is a diagram that illustrates a side cross-sectional view of a Schottky device 100 including a Schottky interface 122A along sidewall 128 and a Schottky interface 122B along sidewall 129 disposed between a pair of trenches including trench 110A and trench 110B. Accordingly, the Schottky interfaces 122A, 122B are aligned along sidewalls 128, 129 of a recess 120 disposed between the trenches 110A, 110B. The trenches 110A, 110B and the recess 120 are disposed in a semiconductor region 101 of the Schottky device 100. In some implementations, the sidewalls 128, 129 can be referred to as sidewall surfaces.

In some implementations, the Schottky device 100 shown in FIG. 1 can be referred to as a Schottky cell or as a Schottky diode. In some implementations, the Schottky interfaces 122A, 122B can be referred to as sidewall Schottky interfaces or as mesa Schottky interfaces. In some implementations, the Schottky interfaces 122A, 122B can be referred to as Schottky contacts.

As shown in FIG. 1, the Schottky interfaces 122A, 122B are collectively formed by the doped regions 124A, 124B and the metal layer 140. The doped regions 124A, 124B are doped with a dopant concentration that forms Schottky interfaces 122A, 122B with the metal layer 140. The Schottky interfaces 122A, 122B can be along sidewalls 128, 129, respectively, of the recess 120.

A bottom surface 125 of the recess 120 excludes, or does not include, a Schottky interface. Accordingly, the bottom surface 125, which is disposed between the Schottky interfaces 122A, 122B, does not define a Schottky interface with the metal layer 140. In some implementations, a doped region 127 of the bottom surface 125 can collectively define an Ohmic interface (or contact) with the metal layer 140. In some implementations, a doped region 127 of the bottom surface 125 can be part of a diode. The doped region 127 is doped with a dopant concentration so that the metal layer 140 does not define a Schottky interface when in contact with the doped region 127.

As shown in FIG. 1, the metal layer 140 defines sidewall (or mesa) Schottky interfaces with the recess 120 (and doped regions 124A, 124B) along the sidewalls 128, 129 of the recess 120 and does not define a Schottky contact along the bottom surface 125 of the recess 120. In some implementations, the metal layer 140 defines sidewall Schottky interfaces with the recess 120 (and doped regions 124A, 124B) along an entirety (e.g., a substantially an entirety) of the sidewalls 128, 129 of the recess 120 and does not define a Schottky contact along an entirety (e.g., a substantially an entirety) of the bottom surface 125 of the recess 120.

As shown in FIG. 1 and as already described, the Schottky device 100 has two Schottky interfaces 122A, 122B in the recess 120. Accordingly, this Schottky device 100 can be referred to as being a two (or dual) Schottky interface approach. This is in contrast to a single Schottky interface approach for a device (not shown). This two Schottky interface approach can have several advantages including relatively fast pinch off when switching from an off-state (e.g., non-conducting state, blocking state) to an on-state (e.g., conducting state). Additional advantages can include, for example, relatively uniform performance even with manufacturing (e.g., fabrication) variability such as misalignment of the recess 120, and/or so forth. These advantages are described in more detail below in connection with the various figures.

In some implementations, the recess 120 can be referred to as a trench. The recess 120 has a depth A1 in the semiconductor region 101 that is shallower than a depth A2 of the trench 110A (and/or the trench 110B). In some implementations, the depth A1 of the recess 120 can be one half or less than one half (e.g., can be shallower by one half) the depth A2 of the trench 110A. In some implementations, the depth A1 of the recess 120 can be more than one half (e.g., can be deeper than one half) of the depth A2 of the trench 110A.

As shown in FIG. 1, each of the trenches 110A, 110B can include, respectively, an electrode 130A, 130B (e.g., a gate electrode). Each of the electrodes 130A, 130B can be insulated from the semiconductor region 101 by a dielectric 131A, 131B. In other words, the trenches 110A, 110B (and sidewalls thereof) are lined by dielectrics 131A, 131B. In some implementations, the electrodes 130A, 130B can be recessed (below a top surface of the semiconductor region 101) within the trenches 110A, 110B.

In some implementations, the Schottky interface 122A and/or the Schottky interface 122B can be along an entirety of the depth A1 of the recess 120. In such implementations, the doped region 124A and/or the doped region 124B can be disposed along an entirety of the depth A1 of the recess 120.

In some implementations, the Schottky interface 122A and/or the Schottky interface 122B can be along less than an entirety of the depth A1 of the recess 120. In such implementations, the doped region 124A and/or the doped region 124B may be disposed along less than an entirety of the depth A1 of the recess 120.

In some implementations, the doped region 127 of the bottom surface 125 can be disposed along an entirety of the bottom surface 125 of the recess 120. In such implementations, an Ohmic interface can be along the entirety of the bottom surface 125 and the recess 120.

In some implementations, the doped region 127 of the bottom surface 125 can be disposed along less than an entirety of the bottom surface 125 of the recess 120. In such implementations, an Ohmic interface can be along less than the entirety of the bottom surface 125 and the recess 120.

The semiconductor region 101 can have a first conductivity type (e.g., can have a doping of the first conductivity type). The doped region 124A can have the first conductivity type. The doped region 124B can have the first conductivity type. In other words, the doped region 124A and/or the doped region 124B can have a doping of the first conductivity type. The doped region 124A and/or the doped region 124B can have the same doping as the doping of the semiconductor region 101. In some implementations, the first conductivity type can be an N-type conductivity.

In some implementations, semiconductor region 101 can be, or can include a portion 103 that is an epitaxial layer (e.g., an epitaxially grown layer) that is disposed on a portion 102 that is a substrate 102. In some implementations, the substrate 102 can be referred to as a N0 semiconductor substrate or can be a base substrate. In some implementations, the portion 103 can be an implanted part of a substrate and the portion 102 can be a base substrate. The thicknesses shown in FIG. 1 may not be representative of an actual or relative thickness of the portion 102 or portion 103.

The dopant concentration of doped region 124A can be less than the dopant concentration of semiconductor region 101. The dopant concentration of doped region 124B can be less than the dopant concentration of semiconductor region 101. In some implementations, the semiconductor region 101 can have an N dopant concentration and the doped region 124A and/or the doped region 124B can have an N− dopant concentration. In some implementations, the semiconductor region 101 can have an N+ dopant concentration. In some implementations, the doped region 124A and/or the doped region 124B can have an N dopant concentration. In some implementations, the dopant concentration for the doped region 124A and/or the doped region 124B can be between 1e16 atoms/cm$^3$ to 1e18 atoms/cm$^3$. The relatively light doping of the doped region 124A and/or the doped region 124B can result in the formation of the Schottky interface 122A and/or the Schottky interface 122B, respectively, with the metal layer 140.

In some implementations, the dopant concentration of doped region 124A can be the same as the dopant concentration of doped region 124B. In some implementations, the dopant concentration of doped region 124A can be different from the dopant concentration of doped region 124B.

The doped region 127 along the bottom surface 125 can have a second conductivity type (e.g., can have a doping of the second conductivity type). The second conductivity type can be opposite the first conductivity type. In some implementations, the second conductivity type can be a P-type conductivity. In some implementations, the second conductivity type can be an N-type conductivity and the first conductivity type can be a P-type conductivity.

In some implementations, the doped region 127 along the bottom surface 125 can have a relatively light dopant concentration or a relatively heavy dopant concentration. The doped region 127 along the bottom surface 125 can have between a P− dopant concentration and a P+ dopant concentration. In some implementations, the dopant concentration for the doped region 127 can be at least 1e18 atoms/cm$^3$ to 1e20 atoms/cm$^3$. Because of the relatively heavy the doped region 127 along the bottom surface 125, in some implementations, the doped region 127 along the bottom surface 125 can form an Ohmic interface with the metal layer 140. In some implementations, the doped region 127 can define a Schottky region with the metal layer 140.

Because the doped region 127 along the bottom surface 125 can have the second conductivity type and the doped region 124A and/or the doped region 124B can have the first conductivity type, the doped region 124A and/or the doped region 124B can have an opposite conductivity type from that of the doped region 127 along the bottom surface 125. Because the doped region 127 along the bottom surface 125 can have the second conductivity type and the semiconductor region 101 can have the first conductivity type, the semiconductor region 101 can have an opposite conductivity type from that of the doped region 127 along the bottom surface 125.

A PN junction can be defined between an interface of the doped region 127 along the bottom surface 125 and the doped region 124A. Similarly, a PN junction can be defined between an interface of the doped region 127 along the bottom surface 125 and the doped region 124B. A PN junction can be defined between an interface of the semiconductor region 101 and the doped region 127 along the bottom surface 125.

As shown in FIG. 1, the doped region 127 along the bottom surface 125 can be vertically disposed between the doped region 124A and/or the doped region 124B and the semiconductor region 101. In other words, the vertical stack can include a PNP stack or an NPN stack (depending on the conductivity types).

The doped region 127 along the bottom surface 125 can have a thickness (e.g., vertical thickness) that is greater than a thickness (e.g., a horizontal thickness) of the doped region 124A and/or the doped region 124B. In some implementations, the doped region 127 along the bottom surface 125 can have a thickness (e.g., vertical thickness) that is less than or equal to a thickness (e.g., a horizontal thickness) of the doped region 124A and/or the doped region 124B

As shown in FIG. 1, a mesa 101A having a width A3 is disposed between the recess 120 and the trench 110A (on a first side of the recess 120). Also, a mesa 101B having a width A4 is disposed between the recess 120 and the trench 110B (on a second side of the recess 120). Relatively narrow widths A3, A4 of the mesas 101A, 101B can facilitate pinch off of the Schottky device 100. Specifically, the relatively narrow widths A3, A4 of the mesas 101A, 101B can facilitate pinch off of the Schottky device 100 when switching between an on-state and an off-state.

When in the on-state, current flows vertically from a top (e.g., anode, source) of the Schottky device 100 (as oriented in FIG. 1) to a bottom of the Schottky device 100 (e.g., cathode, drain). The Schottky device 100 can have a forward voltage drop when in the on-state. A relatively low forward voltage drop can be desirable in some implementations of the Schottky device 100. When in the off-state a leakage current can flow vertically from a bottom of the Schottky device 100 (e.g., cathode, drain) to a top (e.g., anode, source) of the Schottky device 100 (as oriented in FIG. 1). The Schottky device 100 can also have a blocking voltage when in the off-state. A relatively high blocking voltage and a relatively low leakage current can be desirable in some implementations of the Schottky device 100.

The width A3 and/or the width A4 can be less than a width A5 of the recess 120. In some implementations, the width A3 and/or the width A4 can be greater than or equal to the width A5 of the recess 120. In some implementations, the width A5 of the recess 120 can be less than a width (not labeled) of one or more of the trenches 110A, 110B.

The width A3 and/or the width A4 can be less than a width of one or more of the trenches 110A, 110B (widths not labeled). In some implementations, the width A3 and/or the width A4 can be greater than or equal to the width of one or more of the trenches 110A, 110B.

In some implementations, modifying the width A3 and the width A4 can result in a trade-off between a Schottky device being leaky (e.g., permit relatively high current leakage when reverse biased), and an ineffective Schottky device. For example, if the width A3 is too wide, the Schottky device 100 can become relatively leaky (e.g., permit relatively high leakage current when reverse biased). However, if the width A3 is too narrow, a Schottky diode can become ineffective with an on-state resistance and voltage drop that is undesirably high.

In some implementations, the Schottky device 100 can be formed to have a minimum width for width A3 and the width A4 to define a Schottky device because this can minimize the leakage of the Schottky device.

In some implementations, the doped region 127 along the bottom surface 125 can facilitate pinch off of the Schottky device 100 when switching from and on-state to an off-state. Specifically, the doped region 127 along the bottom surface 125, which is oppositely doped relative to the doped regions 124A, 124B, can facilitate pinch off of the Schottky device 100 when switching between an on-state (e.g., conducting state) and an off-state (e.g., non-conducting state). Accordingly, the combination of the doping of the doped regions 124A, 124B with relatively narrow mesas A3, A4, and the doping of the doped region 127 along the bottom surface 125 can facilitate pinch off of the Schottky device 100 when switching from an on-state to an off-state. The doped region 127, which can function generally as a PN diode with the semiconductor region 101, can facilitate e-field shielding so the off-state leakage will be lower.

Although not shown in FIG. 1, in some implementations, a relatively thin layer of a doped region that is oppositely doped can be disposed between, for example, the sidewall 128 and the doped region 124A. This region can be referred to as a thin doped region. This thin doped region can have a width that is less than a width of the doped region 124A. Although described in the context of doped region 124A, a thin doped region can be formed between the sidewall 129 and the doped region 124B.

As a specific example, if the doped region 124A is the first conductivity type, a thin doped region of the second conductivity type can be disposed between the doped region 124A and the sidewall 128. This thin doped region is a region through which tunneling can occur. Accordingly, in some implementations, this thin doped region will not adversely affect the operation of the Schottky device 100.

In some implementations, one or more of the mesas 101A, 101B (and/or regions below one or more of the mesas 101A, 101B) can have a dopant gradient that varies along a vertical direction. This can include a dopant gradient of the doped regions 124A, 124B. In some implementations, the dopant gradient of the doped regions 124A, 124B can be different from the dopant gradient of the mesas 101A, 101B.

For example, in some implementations, a dopant concentration in the mesa 101A can be relatively high at a location relatively close to the metal layer (in an upper portion of the semiconductor region 101), and can be relatively low at a lower depth in the semiconductor region 101 (e.g., a depth around the bottom of the recess 120, a depth around an interface between the portion 103 and the portion 102). Accordingly, the dopant concentration in the mesa 101A can decrease with increasing depth in the semiconductor region 101. The dopant concentration can continue, in some implementations, to decrease below a depth of the bottom of the recess 120. In some implementations, to form a desirable Schottky (e.g., with low on-state drop), doping on the top of the mesas 101A, 101B can be within a certain range (e.g., 1e16 atoms/cm$^3$ to 1e18 atoms/cm$^3$). That level of doping may be relatively low for obtaining desirable resistance (e.g., source to drain resistance when in an on-state (Rds (on)) for the active cell. Therefore a doping gradient from the top of the mesas 101A, 101B to the bottom of the mesas 101A, 101B can be helpful to separately optimize Schottky behavior and an active device (e.g., metal oxide semiconductor field effect transistor (MOSFET) Rds(on)).

As another example, in some implementations, a dopant concentration in the mesa 101A can be relatively low at a location relatively close to the metal layer (in an upper portion of the semiconductor region 101), and can be relatively high at a lower depth in the semiconductor region 101 (e.g., a depth around the bottom of the recess 120, a depth around an interface between the portion 103 and the portion 102). Accordingly, the dopant concentration in the mesa 101A can increase with increasing depth in the semiconductor region 101. The dopant concentration can continue, in some implementations, to increase below a depth of the bottom of the recess 120.

Although not shown in FIG. 1, a dielectric layer (e.g., an insulation layer, a borophosphosilicate glass (BPSG)) can be formed between the metal layer 140 and a top surface of the semiconductor region 101. Also, although not shown, a contact (e.g., a metal) can be formed on a bottom surface of the semiconductor region 101 (e.g., on a bottom surface of portion 102 of the semiconductor region 101) as part of a drain or cathode.

FIG. 1 illustrates two Schottky interfaces including Schottky interface 122A and Schottky interface 122B. In some implementations, the Schottky device 100 can be configured with a single Schottky interface. Specifically, the device can be configured with a single Schottky interface on one sidewall of the recess 120 and can exclude a Schottky interface one an opposite sidewall of the recess 120. In some implementations, this could be formed by masking one sidewall of recess 120 during processing.

Figure 2:
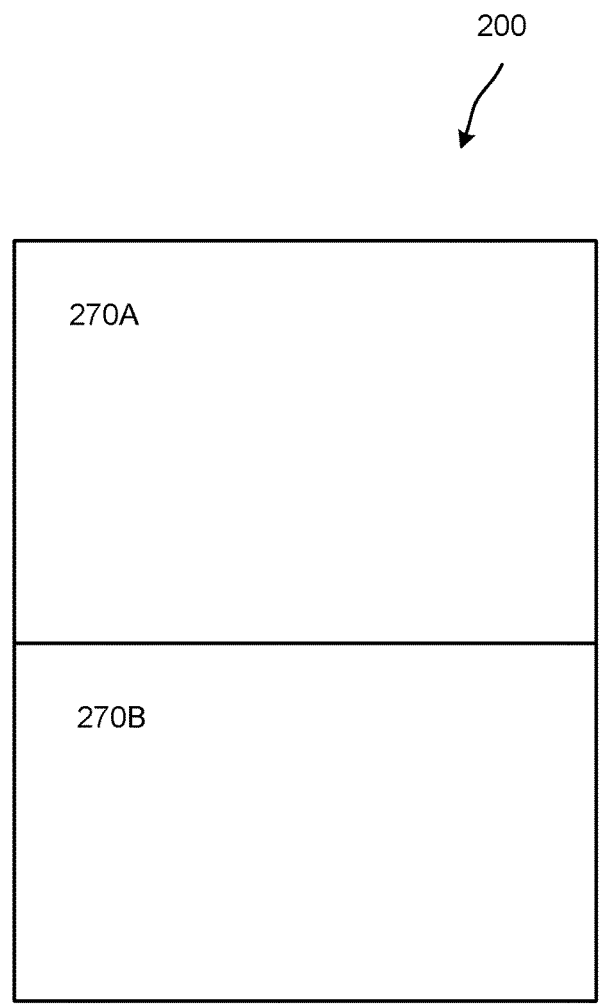
FIG. 2 illustrates a plan view of a device including an active side and a Schottky side.

The Schottky device 100 (or Schottky cell) shown in FIG. 1 can be included in a Schottky side of a device. Such a device is illustrated in FIG. 2. As shown in FIG. 2, a plan view of a device 200 includes an active side 270A and a Schottky side 270B. The Schottky device 100 shown in FIG. 1 can be included in the Schottky side 270B of the device 200. The active side 270A can include, for example, any type of a MOSFET (e.g., a power MOSFET, a vertical MOSFET, a lateral MOSFET).

In some implementations, the active side 270A and the Schottky side 270B of the device 200 can have different shapes. In some implementations, the device 200 can include multiple active regions and/or multiple Schottky regions. In some implementations, the device 200 can include Schottky regions that are interleaved (e.g., along parallel trenches) within an active region. In other words, Schottky trenches can be interleaved with (and parallel with) active trenches.

The Schottky side 270B can be separate from the active side 270A of the device 200. For example, the Schottky side 270B can include parallel trenches that are not continuous with (e.g., not coupled to, separated from) parallel trenches of the active side 270A. In some implementations, the Schottky side 270B can be separated from the active side 270A by a termination trench (now shown). In some implementations, the Schottky side 270B may not be separated from the active side 270A by a termination trench.

Figure 3:
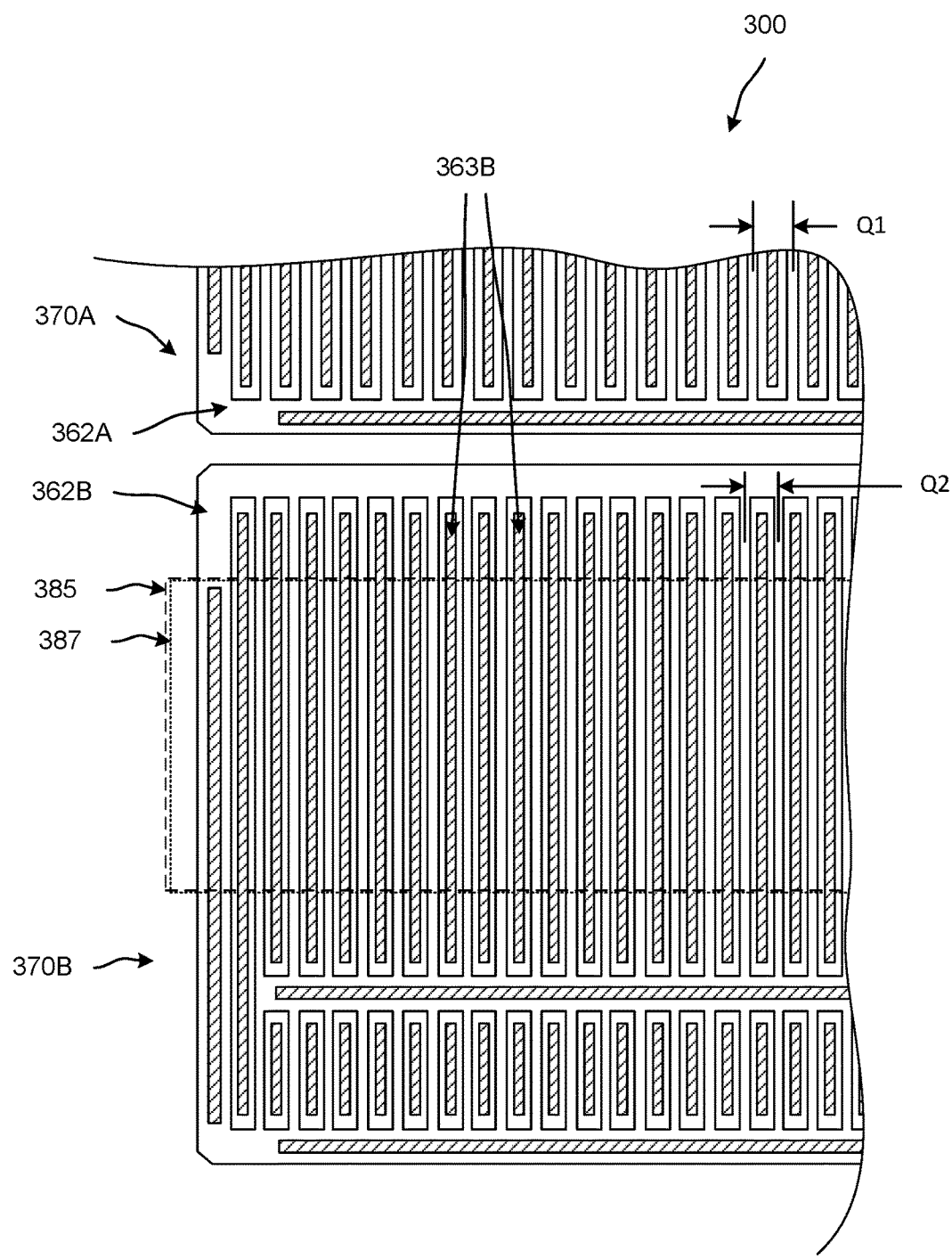
FIG. 3 is a diagram that illustrates a plan view a portion of a device that is an example of the device shown in FIG. 2.

FIG. 3 is a diagram that illustrates a plan view of a portion of a device 300 that is an example of the device 200 shown in FIG. 2. As shown in FIG. 3, the device 300 includes an active side 370A and a Schottky side 370B. The active side 370A and the Schottky side 370B include trenches 362A (e.g., parallel trenches) and trenches 362B (e.g., parallel trenches), respectively. A pair of trenches from the trenches 362B from the Schottky side 370B can correspond to a pair of trenches 110A, 110B shown in the Schottky device 100 shown in FIG. 1 (although FIG. 1 is a side cross-sectional view and FIG. 3 is a top or plan view).

The Schottky side 370B includes Schottky interfaces 363B (of which only a few are labeled). A well block 385 (e.g., a well region block, P-well block) and a source block 387 can be used to define a Schottky region within the Schottky side 370B of the device 300 during fabrication. In some implementations, the well block 385 can be referred to as a body block (e.g., a body region block). The active devices included in the active side 370A can be distinguished from Schottky devices included in the Schottky side 370B because the active devices will include a well region (and well contact (e.g., a body contact)) as well as source regions (and source contacts). The Schottky devices included in the Schottky side 370B can each exclude a well region (and contact) as well as a source region (and contact). Although not shown in FIG. 3, a metal layer can be disposed over the Schottky region.

Although not shown, in an active device, a well region can be formed in a top portion of a semiconductor region 101 of the active device between trenches (such as the trenches 110A, 110B) shown in FIG. 1. In other words, the well region can be formed in a mesa between a pair of adjacent trenches (e.g., adjacent parallel trenches). A source region can be formed in a top portion of the well region. The source region can have conductivity type that is the same as that of the semiconductor region, and the well region can have a conductivity type that is opposite that of the semiconductor region.

As shown in FIG. 3, the trenches 364A in the active side 370A have a distance Q1 between adjacent trenches (also can be referred to as a trench pitch), and the trenches 364B in the Schottky side 370B have a distance Q2 between adjacent trenches (also can be referred to as a trench pitch). In some implementations, the distance Q1 between the adjacent trenches within the trenches 364A in the active side 370A can be different from the distance Q2 between the adjacent trenches within the trenches 364B in the Schottky side 370B. In some implementations, adjacent trenches can be referred to as a pair of adjacent trenches. In some implementations, the distance Q1 and the distance Q2, because they are associated with cells of the active side 370A and the Schottky side 370B, can be referred to as a cell pitch. The cell pitch of the active side 370A and the cell pitch of the Schottky side 370B can be independently defined or formed.

In some implementations, the Schottky side 370B can be separated from the active side 370A by a termination trench (now shown). In some implementations, the Schottky side 370B may not be separated from the active side 370A by a termination trench.

In some implementations, the Schottky side 370B can be separated from the active side 370A by a termination trench (not shown) so that the distance Q2 between the trenches 362B of the Schottky side 370B can be different than (e.g., greater than, less than) the distance Q1 between the trenches 362A of the active side 370A. In some implementations, the Schottky side 370B can be separated from the active side 370A by a termination trench (not shown) so that the cell pitch of the Schottky devices included in the Schottky side 370B can be different the cell pitch of the active devices included in the active side 370A.

Although not shown, in some implementations, Schottky devices and the active devices can be formed in the same trenches. In other words, a Schottky device and an active device can be formed in parallel trenches where a first portion of the parallel trenches has a Schottky region and a second portion of the parallel trenches has an active region.

In implementations where the distance Q2 between the trenches 362B of the Schottky side 370B is the same as the distance Q1 between the trenches 362A of the active side 370A, a termination trench may not be disposed between the Schottky side 370B and the active side 370A. In other words, in implementations where the cell pitch of Schottky devices included in the Schottky side 370B is the same as the cell pitch of active devices included in the active side 370A a termination trench may not be disposed between the Schottky side 370B and the active side 370A.

Figure 4:
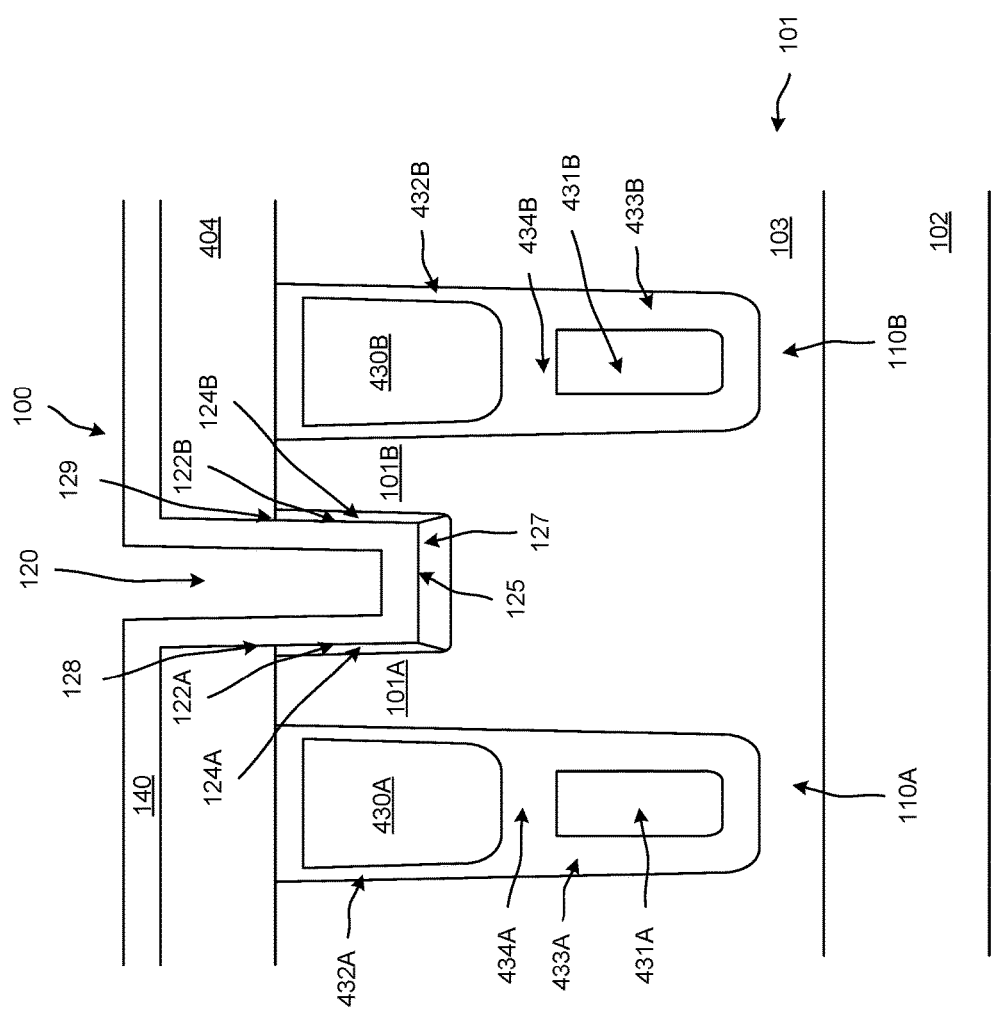
FIG. 4 is a diagram that illustrates a side cross-sectional view of a variation of the device shown in FIG. 1.

FIG. 4 is a diagram that illustrates a side cross-sectional view of a variation of the device 100 shown in FIG. 1. Any of the features shown in FIG. 4 can be incorporated into the device 100 shown in FIG. 1.

As shown in FIG. 4, each of the trenches 110A, 110B includes an additional electrode compared with those shown in FIG. 1. For example, trench 110A includes a gate electrode 430A and a shield electrode 431A. In some implementations, the gate electrode 430A and the shield electrode 431A can be electrically coupled together (e.g., shorted together) to reduce, for example, gate capacitance of the device 100. For example, the gate electrode 430A and the shield electrode 431A can both be coupled to a source potential or both can be coupled to a gate potential. In some implementations, the gate electrode 430A and the shield electrode 431A can be at different potentials. For example, the gate electrode 430A can be coupled to a gate potential, and the shield electrode 431A can be coupled to a source potential.

In some implementations, when Schottky devices and active devices are formed in same trenches, gate and shield electrodes may not be electrically coupled together for the Schottky devices because doing so would also short gate and shield electrodes for the active devices, which could be detrimental to the performance of the active devices.

The gate electrode 430A is insulated from semiconductor region 101 by a gate dielectric 432A. At least a portion of the sidewall of the trench 110A is lined with the gate dielectric 432A. The shield electrode 431A is insulated from semiconductor region 101 by a shield dielectric 433A. At least a portion of the sidewall of the trench 110A is lined with the shield dielectric 433A. The gate electrode 430A is insulated from the shield electrode 431A by an inter-electrode dielectric 434A.

As shown in FIG. 4, a dielectric layer 404 (e.g., an insulation layer, BPSG) can be disposed on the semiconductor region 101 and above the trenches 110A, 110B. The recess 120 can be disposed in (e.g., formed through) the dielectric layer 404 and at least a portion of the semiconductor region 101. The metal layer 140 can be disposed on the dielectric layer 404.

Figure 5A:
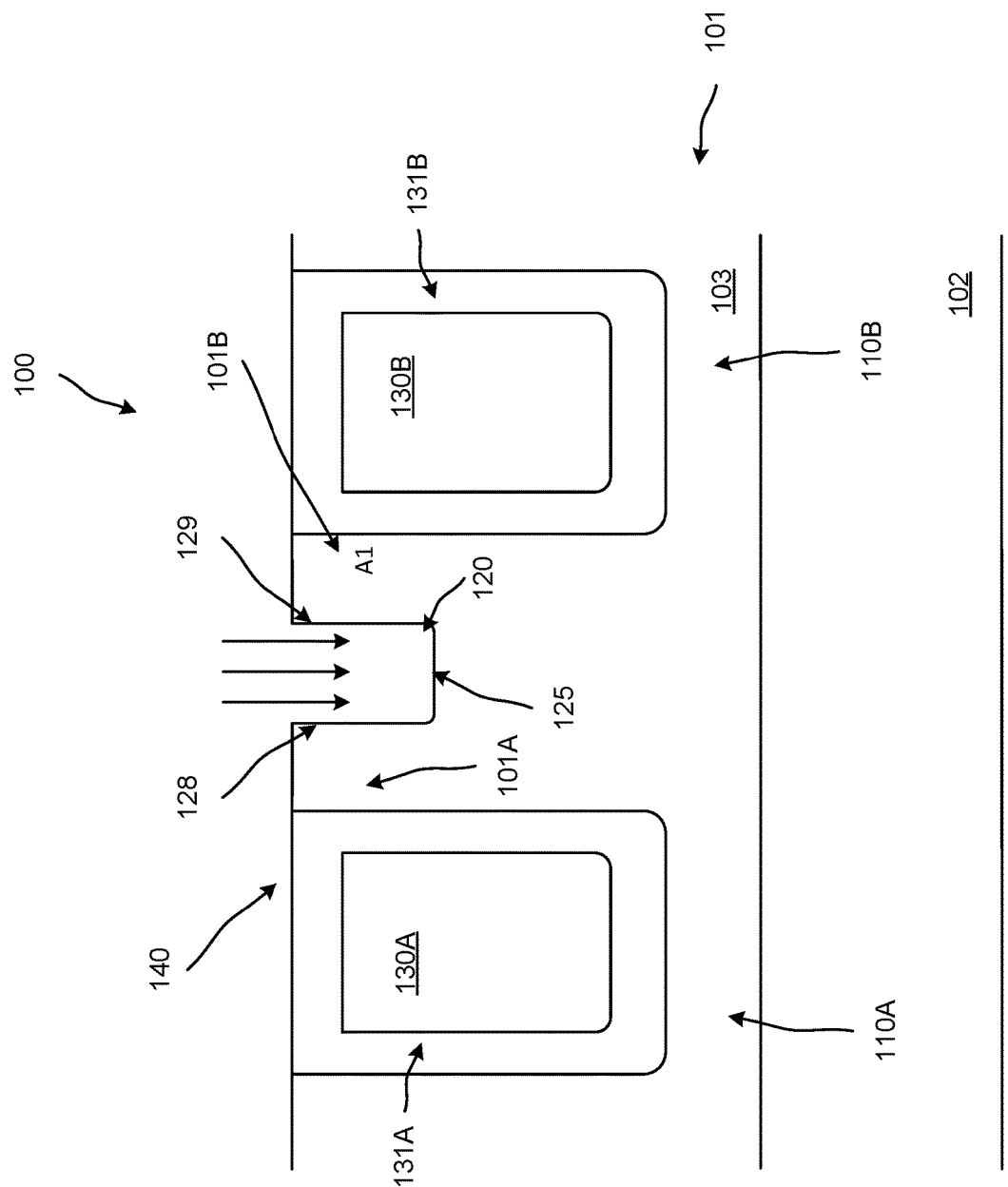
FIGS. 5A and 5B illustrate parts of a method of producing the device shown in, for example, FIG. 1.

FIG. 5A illustrates part of a method of producing the device 100 shown in, for example, FIG. 1. Although based on the diagram shown in FIG. 1, the same processing principles can be applied to other of the implementations including those shown in, for example, FIGS. 2 through 4. FIG. 5A illustrates the device 100 before the doped regions 124A, 124B, and 127 are formed.

Figure 5B:
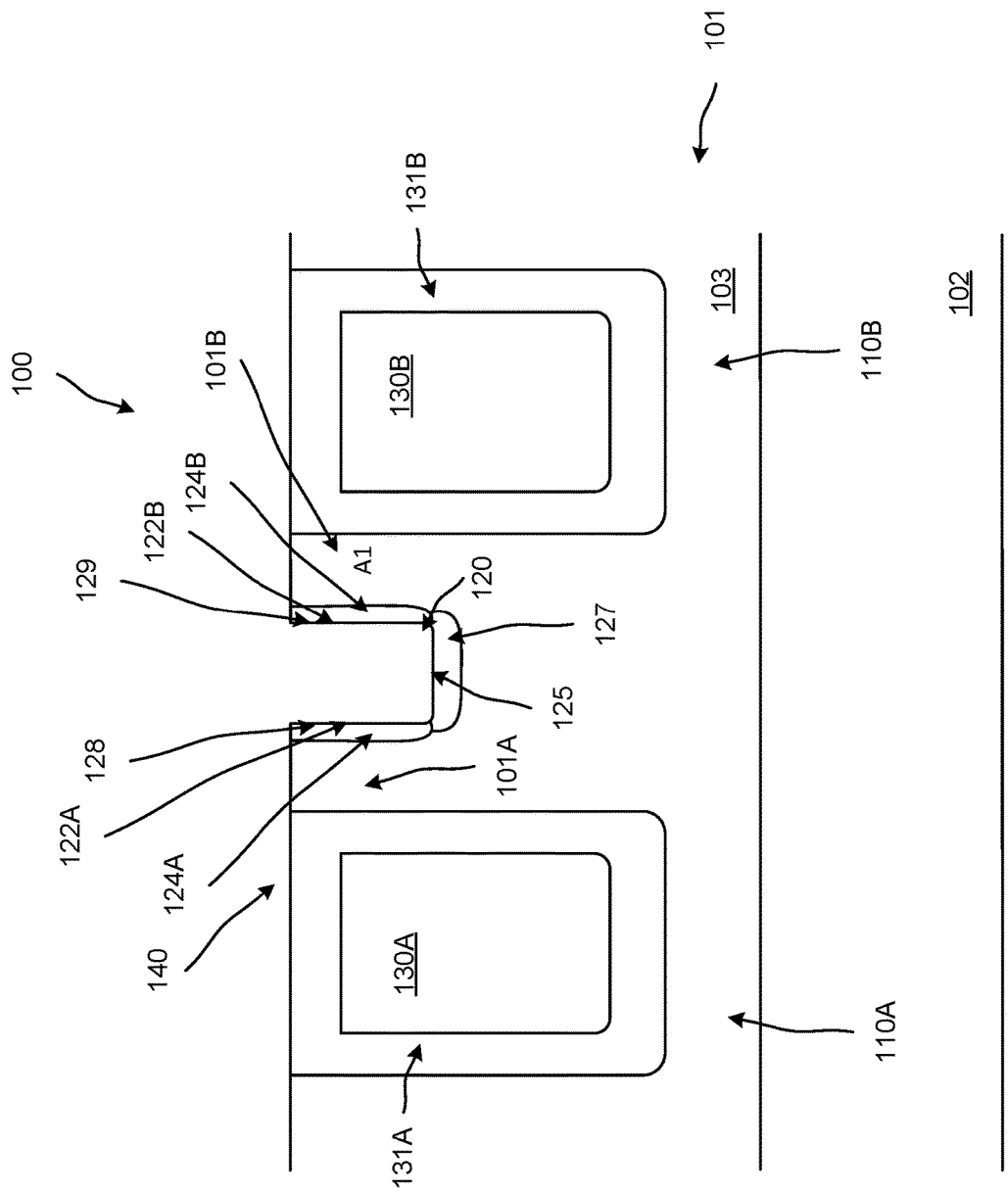

After formation of the trenches 110A, 110B and formation of the recess 120 in the semiconductor region 101, a dopant can be implanted into the recess 120 (represented by the vertical lines) during an implant process. In response to the implant process the doped regions 124A, 124B, and 127 are formed. The device 100, after formation of the doped regions 124A, 124B, and 127, is shown in FIG. 5B.

As shown in FIG. 5A, the implant can be a directional implant. Specifically, the directional implant can generally be in a downward direction toward the device 100. Because the implant is a directional implant, an amount of dopant implanted into region 127 is greater than an amount of dopant implanted into regions 124A and 124B. Also, a width (e.g., a horizontal width) of each of the doped regions 125A, 125B can be less than a thickness (e.g., a vertical thickness) of the doped region 127. Because the implant is a directional implant, a dopant dose implanted into region 127 is greater than a dopant dose implanted into regions 124A and 124B.

For example, the semiconductor region 101 shown in FIG. 5A can be a first conductivity type (e.g., an N-type conductivity). The implant process can be performed using a dopant of a second conductivity type (e.g., a P-type conductivity, a Boron implant (e.g., a deep Boron implant)). Because the implant can be directional in a generally downward direction, during the implant process, the sidewalls 128, 129 (and regions adjacent thereto) can be doped with less dopant than the bottom surface 125 (and regions adjacent thereto). Specifically, during the implant process the dopant rate into the sidewalls 128, 129 (and regions adjacent thereto) can be less than the dopant rate into the bottom surface 125 (and regions adjacent thereto).

Accordingly, the portions of the semiconductor region, which are of the first conductivity type, that become the doped regions 124A, 124B via the implanting of the sidewalls 128, 129 can become more lightly doped material of the first conductivity type. The portion of the semiconductor region, which is of the first conductivity type, becomes the doped regions 127 via the implanting of the bottom surface 125 can become a material of the second conductivity type. In other words, the doped regions 124A, 124B can be changed into more lightly doped region (of the same conductivity type) during the implant process, while the doped region 127 can be changed to an opposite conductivity type during the same implant process. The implant process can be considered a compensation implant.

In some implementations, the implant can be a 0° tilt implant (e.g., a vertical implant with no tilt). In some implementations, the implant can be a single implant processing step, or can include multiple implant processing steps. In some implementations, an anneal process can be performed after the implant process has been completed.

In some implementations, the implant can have a tilt (e.g., a nonzero tilt) between, for example, 0° tilt and 15° tilt (e.g., 3° tilt, 7° tilt, 10° tilt). In some implementations, a first implant having a first tilt can be performed and a second implant having a second tilt can be performed. The first implant and the second implant can be performed during separate implant processes. The first implant can be directed toward a first sidewall of the recess and the second implant can be directed towards a second sidewall of the recess.

Although not shown in FIG. 5B, the metal layer can be formed on the semiconductor region 101, in the recess 120, and above the trenches 110A, 110B. Although not shown in FIG. 5B, in some implementations a dielectric layer can be formed on the semiconductor region 101 and above the trenches 110A, 110B before the recess 120 is formed and before an implant process is performed. In such implementations, the recess 120 can be formed through the dielectric layer.

Figure 6:
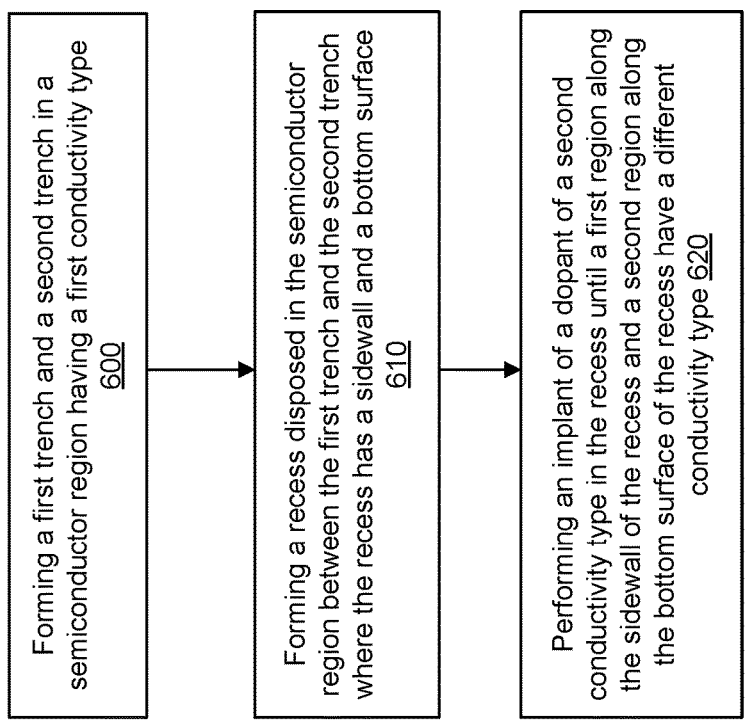
FIG. 6 is a diagram that illustrates a method of producing a Schottky device.

FIG. 6 is a diagram that illustrates a method of producing a Schottky device as described herein. The Schottky device can be any of the Schottky devices described herein.

As shown in FIG. 6, a first trench and a second trench are formed in a semiconductor region having a first conductivity type (block 600). The first trench and the second trench can be etched into the semiconductor region. The first trench and the second trench can be a trenches included in a plurality of parallel trenches in a Schottky region. The first trench and the second trench can be formed while trenches of an active region are being formed. In some implementations, the semiconductor region can include an epitaxial layer, a substrate, an implanted layer and/or so forth.

A recess disposed in the semiconductor region can be formed between the first trench and the second trench where the recess has a sidewall and a bottom surface (block 610). In some implementations, the recess can be centered between the first and second trenches. In some implementations, the recess can have a depth that is less than a depth of each of the first and second trenches. In some implementations, the recess can have a width that is less than a width of each of the first and second trenches. In some implementations, the recess can be formed through a dielectric layer disposed on the semiconductor region.

An implant of a dopant of a second conductivity type is implanted in the recess until a first region along the sidewall of the recess and a second region along the bottom surface of the recess have a different conductivity type. In some implementations, the first region can have a width that is less than a thickness of the second region. In some implementations, the first region can have a dopant concentration that is less than a dopant concentration of the semiconductor region. In some implementations, the implanting can be a directional implant without a tilt (e.g., a 0° tilt). In some implementations the implanting can be a directional implant with a tilt.

In some implementations, a metal layer can be disposed on the sidewall and the bottom surface of the recess. The first region and the metal layer can collectively define a Schottky interface. The second region and the metal layer can collectively define an Ohmic interface.

This method of manufacturing eliminates additional contact layer processing (i.e., a separate contact for the active region and the Schottky region), which may be required by other fabrication processes. Accordingly, fabrication cost and process complexity can be reduced.

In general, it may be desirable to manufacture relatively high numbers of Schottky devices and active devices per square centimeter. To do so, cell pitches may be decreased and semiconductor regions may be doped with a relatively high doping. This relatively high doping may be needed to increase conductivity and to reduce resistance of the devices to a desirable extent when in an on-state. However, increasing the conductivity with a relatively high doping of the semiconductor region can make the devices more sensitive to manufacturing defects or variations especially with respect to compensation implants. The Schottky device 100, however, with sidewall Schottky interfaces is relatively robust against such manufacturing variability. Some of the features that provide consistent and predictable performance of the Schottky device 100 despite manufacturing variability are described below.

In some implementations, an implant process (e.g., a depth of an implant process, a dose of an implant process, a tilt of an implant process, and/or so forth), cell pitch, recess critical dimension, and/or so forth, can be used to control forward bias voltage drop, leakage, blocking voltage, and/or so forth, of, for example, the Schottky device 100 shown in FIG. 1. In some implementations a relatively light dopant concentration (of the first conductivity type) of the doped regions 124A, 124B, and a relatively heavy dopant concentration (of the second conductivity type) of the doped region 127 can result in a relatively leaky device (e.g., with an undesirable leakage current when reversed biased and in an off-state). In some implementations, a relatively heavy dopant concentration (of the first conductivity type) of the doped regions 124A, 124B, and a lighter dopant concentration (of the second conductivity type) of the doped region 127 can result in a relatively low forward bias voltage drop across the Schottky device when in an on-state.

In some implementations, the recess 120 of the Schottky device 100 can be the same (e.g., same dimension, same depth, same width) as a recess of a contact trench (between parallel trenches) of an active device (not shown). In some implementations, the recess 120 of the Schottky device 100 can be different (e.g., different dimension, different depth, different width) from a recess of a contact trench (between parallel trenches) of an active device (not shown). The recess 120 of the Schottky device 100 can have dimensions that are defined different from the dimensions of the recess of the contact trench of the active device so that leakage characteristics of the Schottky device 100 can be controlled in a desirable fashion.

Figure 7:
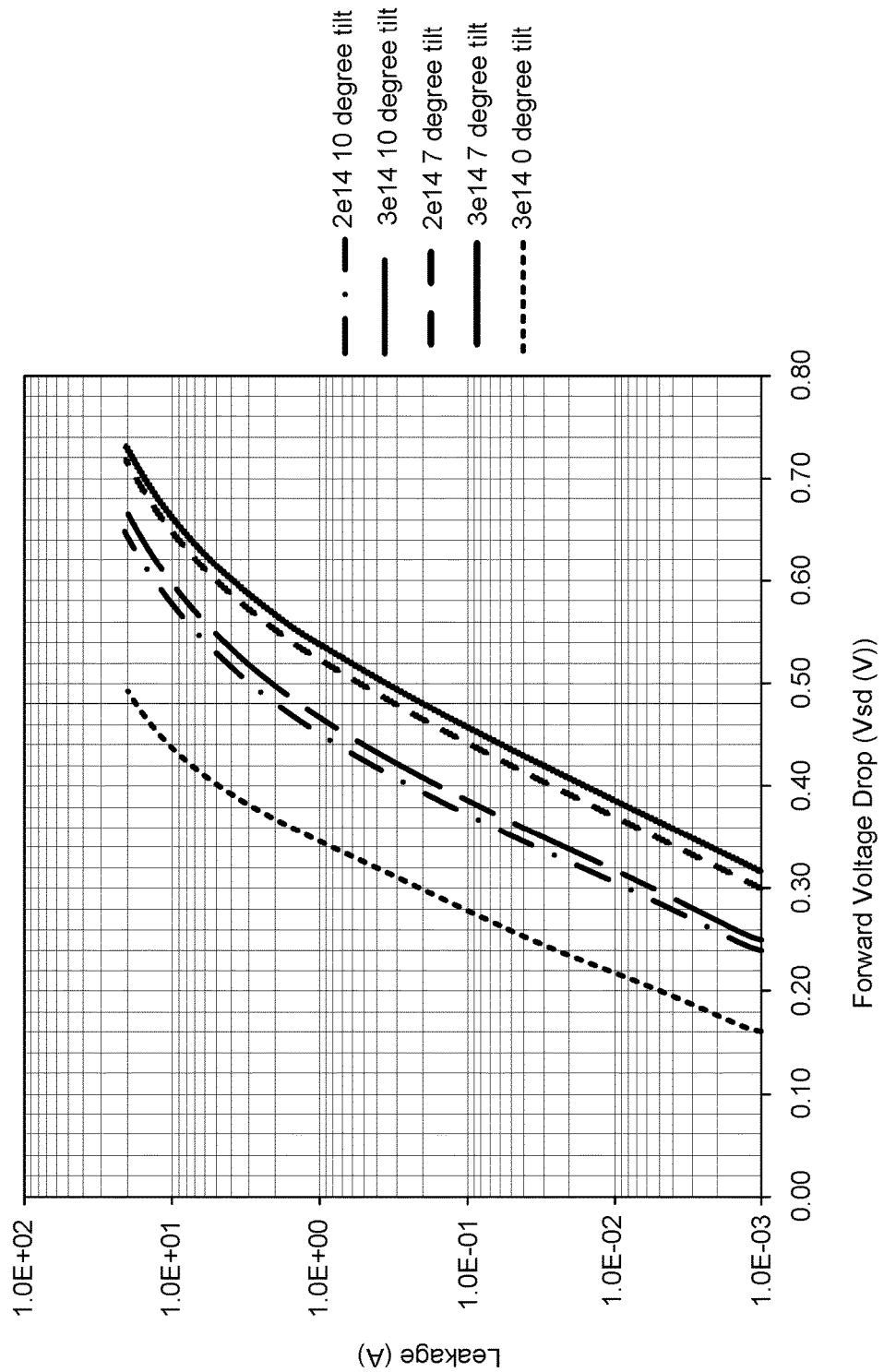
FIGS. 7 through 9 are graphs that illustrate relationships between leakage and forward voltage drop for Schottky devices based on a variety of processes.

FIG. 7 is a graph that illustrates a relationship between leakage (A) (e.g., drain to source leakage) and forward voltage drop (Vsd (V)) for a Schottky device (e.g., Schottky device 100) based on different implant processes. The forward voltage drop can be a forward voltage drop between anode and cathode (or source to drain). The implant processes include the following: 3e14/20KeV/7 degree tilt with rotation, 2e14/20KeV/10 degree tilt with rotation, 3e14/20KeV/0 degree tilt. As shown in FIG. 7, the Schottky device with the 0° tilt implant has a relatively low breakdown voltage due to relatively high leakage (e.g., leakage when reversed biased). However, the forward voltage drop across the Schottky device is relatively low. At a given leakage current, the forward voltage drop generally increases with increasing tilt. Also, at a given forward voltage drop, the leakage current generally increases with decreasing tilt.

Figure 8:
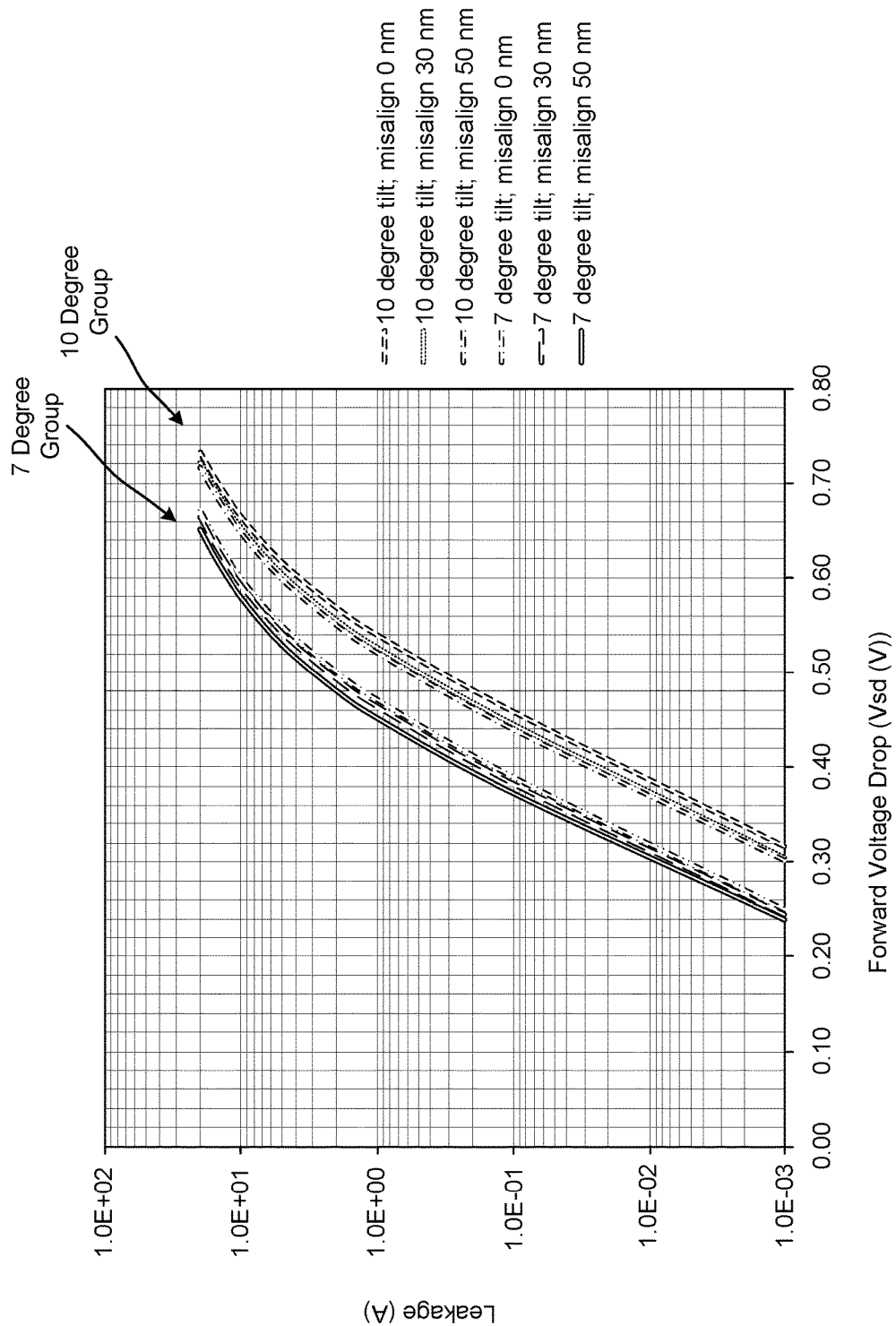

FIG. 8 is a graph that illustrates a relationship between leakage (A) and forward voltage drop (Vsd (V)) for a Schottky device (e.g., Schottky device 100) based on a combination of recess misalignment and tilt. The misalignment can be misalignment so that a recess is not centered between trenches of a Schottky device. For example, in FIG. 1, the recess 120 is centered when width A3 is equal to width A4. The recess 120 is misaligned when width A3 is not equal to width A4 so that recess 120 is closer to one of the trenches 110A, 110B.

The Schottky devices that are produced using a 7 degree tilt at various misalignments are labeled as the 7 degree group, and the Schottky devices that are produced using a 10 degree tilt at various misalignments are labeled as the 10 degree group. As shown in FIG. 8, the performance of the Schottky device is relatively unaffected by misalignment, but is instead more affected by tilt of an implant process. The 7 degree group is separated from the 10 degree group, but the misaligned Schottky devices within each group have similar performance. This graph also illustrates that forward voltage drop is lower for the 7 degree group as compared with the 10 degree group.

This characteristic described above can be advantageous in that Schottky devices can be robust against manufacturing variability with respect to misalignment. Because the Schottky devices include sidewall Schottky interfaces aligned along the recess, misalignment of the recess is balanced by the characteristics of each of the Schottky interfaces. A more leaky Schottky interface on a first side of the recess due to misalignment of the recess is balanced by a less leaky Schottky interface on a second side of the recess due to the same misalignment of the recess. A width of the mesa associated with the Schottky interface on the first side may be increased, while a width of the mesa associated with the Schottky interface on the second side may be decreased.

Figure 9:
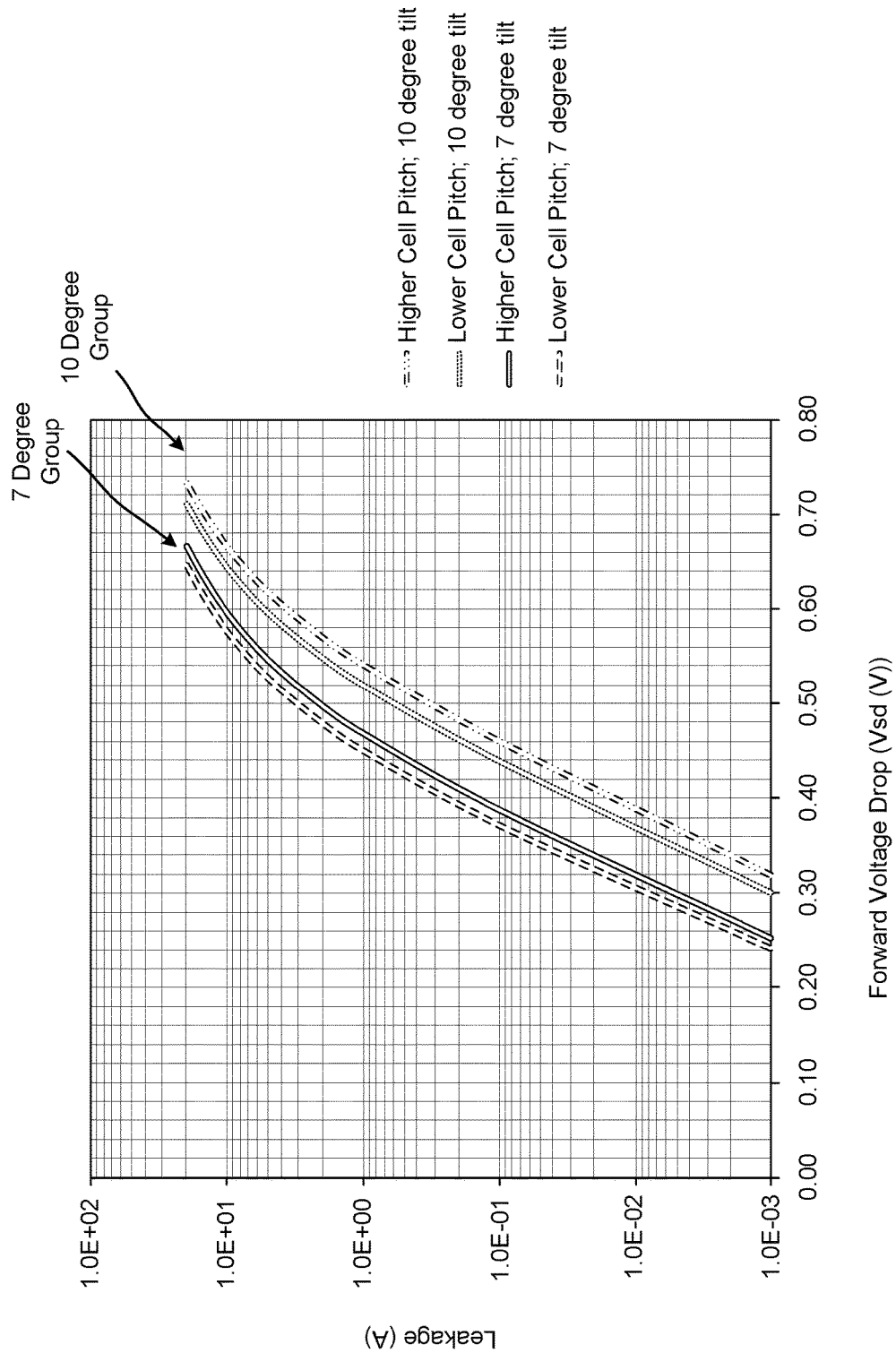

FIG. 9 is a graph that illustrates a relationship between leakage (A) and forward voltage drop (Vsd (V)) for a Schottky device (e.g., Schottky device 100) based on a combination of cell pitch distance and tilt. The relative cell pitch distances are shown in FIG. 9.

The Schottky devices that are produced using a 7 degree tilt at various cell pitches are labeled as the 7 degree group, and the Schottky devices that are produced using a 10 degree tilt at various cell pitches are labeled as the 10 degree group. As shown in FIG. 9, the performance of the Schottky device is relatively unaffected by cell pitch, but is instead more affected by tilt of an implant process. The 7 degree group is separated from the 10 degree group, but the cell pitches of the Schottky devices within each group have similar performance. This graph also illustrates that forward voltage drop is lower for the 7 degree group as compared with the 10 degree group. These characteristics described above can be advantageous in that Schottky devices can be robust against manufacturing variability with respect to cell pitch.

Figure 10:
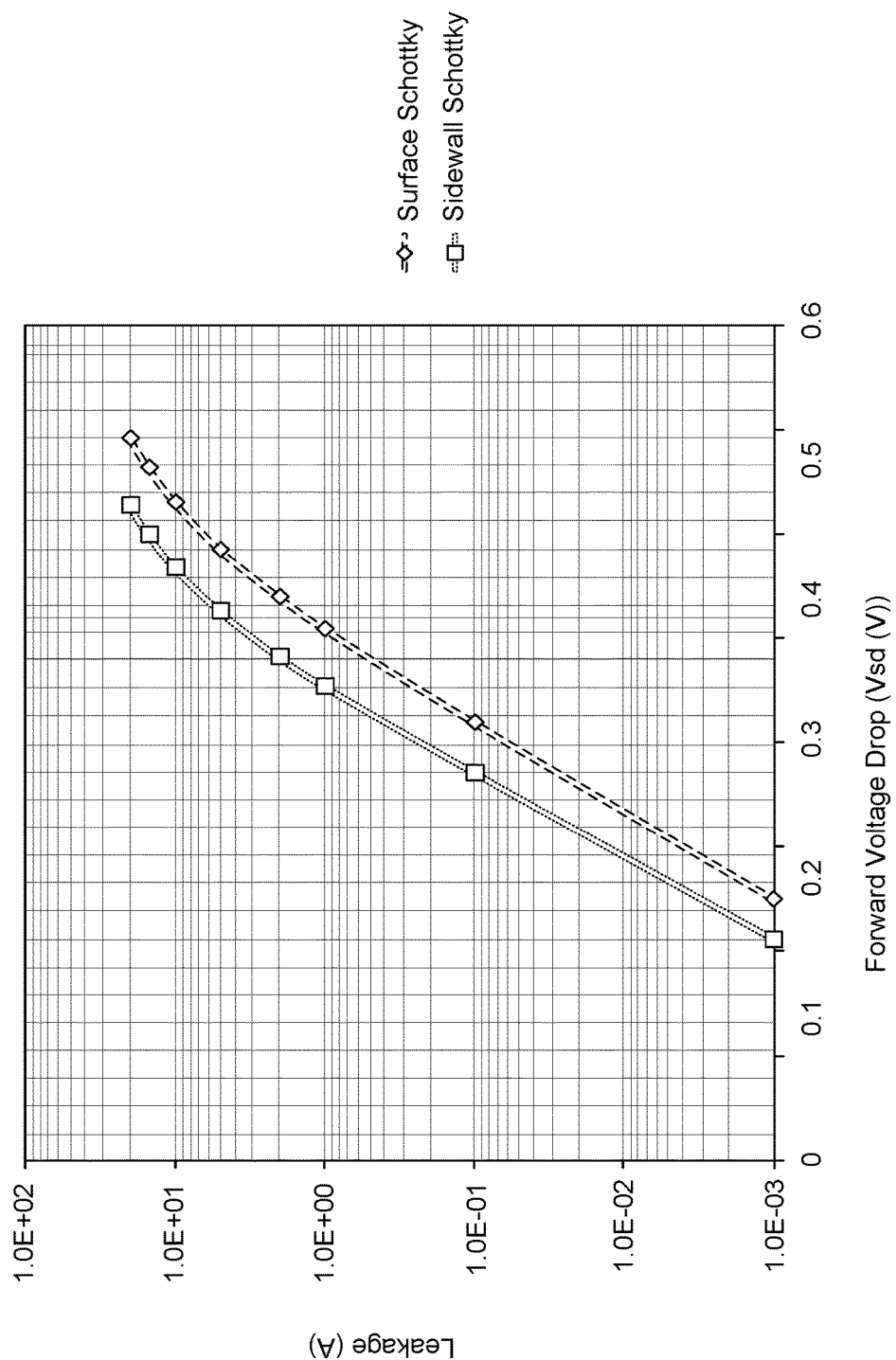
FIG. 10 is a graph that illustrates a relationship between leakage and forward voltage drop for a surface Schottky device and a sidewall Schottky device.

FIG. 10 is a graph that illustrates a relationship between leakage (A) and forward voltage drop (Vsd (V)) for a surface Schottky device and a sidewall Schottky device (e.g., Schottky device 100). As shown in FIG. 10, the sidewall Schottky has a relatively low forward voltage drop (at particular leakage) as compared with the surface Schottky device.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application-specific integrated circuit).

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

Some implementations may be implemented using various semiconductor processing and/or packaging techniques. Some implementations may be implemented using various types of semiconductor processing techniques associated with semiconductor substrates including, but not limited to, for example, Silicon (Si), Silicon Carbide (SiC), Galium Arsenide (GaAs), Galium Nitride (GaN), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A device, comprising:
a first trench disposed in a semiconductor region;
a second trench disposed in the semiconductor region;
a recess disposed in the semiconductor region between the first trench and the second trench, the recess having a sidewall and a bottom surface; and
a Schottky interface formed by a first portion of the semiconductor region disposed along a sidewall of the recess, the first portion of the semiconductor region disposed along the sidewall having a dopant concentration less than a doping concentration of a second portion of the semiconductor region disposed between the first portion and the first trench in a direction perpendicular to the sidewall, the semiconductor region having a third portion disposed along the bottom surface of the recess and defining a PN junction with the first portion of the semiconductor region.

2. The device of claim 1, further comprising:
a Schottky side including the first trench, the second trench, and the recess; and
an active side separate from the Schottky side and including a plurality of trenches.

3. The device of claim 2, wherein the first trench and the second trench are separated by a distance different than a distance between a pair of adjacent trenches from the plurality of trenches.

4. The device of claim 1, wherein the recess has a depth in the semiconductor region less than a depth in the semiconductor region of the first trench.

5. The device of claim 1, wherein the sidewall is a first sidewall, the Schottky interface is a first Schottky interface, the recess has a second sidewall,
the device further comprising:
a second Schottky interface along the second sidewall of the recess.

6. The device of claim 1, wherein the sidewall is a first sidewall, the Schottky interface is a first Schottky interface, the recess has a second sidewall,
the device further comprising:
a second Schottky interface along the second sidewall of the recess,
the bottom surface being disposed between the first Schottky interface and the second Schottky interface.

7. The device of claim 1, wherein the trench includes a gate electrode and a shield electrode.

8. The device of claim 1, wherein the trench includes an electrode disposed in the first trench and a dielectric disposed between a sidewall of the trench and the electrode.

9. A device, comprising:
a first trench disposed in a semiconductor region having a first conductivity type;
a second trench disposed in the semiconductor region;
a recess disposed in the semiconductor region between the first trench and the second trench, the recess having a sidewall and a bottom surface, the semiconductor region having a width W perpendicular to the sidewall between the first trench and the sidewall;
a first portion of the semiconductor region along the sidewall, the first portion having a width W1 perpendicular to the sidewall with W1<W and having dopant concentration less than a dopant concentration of a second portion of the semiconductor region adjacent to the first portion,
a third portion of the semiconductor region disposed along the bottom surface having a second conductivity, the third portion defining a PN junction with the first portion of the semiconductor region; and a metal in contact with the first region and the third portion.

10. The device of claim 9, wherein the third portion and the semiconductor region define a PN diode.

11. The device of claim 9, wherein the metal and the first portion collectively define a Schottky interface.

12. The device of claim 9, wherein the metal and the third portion collectively define an Ohmic interface.

13. The device of claim 9, wherein the first portion has a width less than a thickness of the second portion.

14. The device of claim 9, further comprising:
a Schottky side including the first trench, the second trench, and the recess; and
an active side separate from the Schottky side and including a plurality of trenches,
the first trench and the second trench are separated by a distance different than a distance between a pair of adjacent trenches from the plurality of trenches.

15. The device of claim 9, wherein the recess has a depth in the semiconductor region less than a depth in the semiconductor region of the first trench.

16. The device of claim 9, wherein the trench includes a gate electrode and a shield electrode.

17. The device of claim 9, wherein the sidewall is a first sidewall, the recess having a second sidewall,
the device further comprising:
a fourth-portion along the second sidewall and having the first conductivity type, the third portion being disposed between the first portion and the fourth portion.

* * * * *